United States Patent
Liu et al.

(10) Patent No.: US 9,978,304 B2
(45) Date of Patent: May 22, 2018

(54) ORGANIC LIGHT EMITTING DIODE (OLED) TOUCH DISPLAY DEVICE

(71) Applicant: TPK Touch Solutions Inc., Taipei (TW)

(72) Inventors: Chen-Yu Liu, Taoyuan (TW); Li-Wei Kung, Taoyuan (TW); Hsi-Chien Lin, Hsinchu (TW)

(73) Assignee: TPK Touch Solutions Inc., Taipei (TW)

( * ) Notice: Subject to any disclaimer, the term of this patent is extended or adjusted under 35 U.S.C. 154(b) by 231 days.

(21) Appl. No.: 14/539,998

(22) Filed: Nov. 12, 2014

(65) Prior Publication Data

US 2015/0130736 A1    May 14, 2015

(30) Foreign Application Priority Data

Nov. 12, 2013  (CN) .......................... 2013 1 0560443

(51) Int. Cl.

| | |
|---|---|
| *G06F 3/041* | (2006.01) |
| *G09G 3/3208* | (2016.01) |
| *G06F 3/044* | (2006.01) |
| *H01L 27/32* | (2006.01) |

(52) U.S. Cl.
CPC ........... *G09G 3/3208* (2013.01); *G06F 3/044* (2013.01); *G06F 3/0412* (2013.01); *H01L 27/323* (2013.01)

(58) Field of Classification Search
CPC ... H01L 27/323; H01L 27/3225; G06F 3/044; G06F 3/045
USPC .................................................. 345/174, 76
See application file for complete search history.

(56) References Cited

U.S. PATENT DOCUMENTS

| | | | |
|---|---|---|---|
| 5,739,296 A | 4/1998 | Gvon et al. | |
| 6,697,132 B2* | 2/2004 | Saiki | G02B 5/3033 349/10 |
| 7,786,092 B2* | 8/2010 | Liu | A61K 9/5146 514/44 R |
| 7,986,092 B2 | 7/2011 | Kim | |
| 2008/0211395 A1* | 9/2008 | Koshihara | G06F 3/044 313/504 |
| 2009/0015761 A1* | 1/2009 | Stockham | G06F 3/0412 349/96 |
| 2010/0102713 A1* | 4/2010 | Seo | H01L 51/525 313/504 |
| 2010/0309150 A1* | 12/2010 | Lee | G06F 3/0412 345/173 |
| 2012/0147467 A1* | 6/2012 | Park | G06F 3/044 359/488.01 |
| 2012/0235928 A1* | 9/2012 | Chang | H01L 27/323 345/173 |

(Continued)

FOREIGN PATENT DOCUMENTS

| | | |
|---|---|---|
| CN | 101135797 A | 3/2008 |
| CN | 102279662 A | 12/2011 |

(Continued)

*Primary Examiner* — Yuzhen Shen

(74) *Attorney, Agent, or Firm* — Paul David Bendemire

(57) ABSTRACT

An OLED touch display device includes an OLED display and a laminated package component covering the OLED display and including a quarter-wave plate, a liquid crystal polarizer, a first touch sensor layer and a second touch sensor layer. The first touch sensor layer and the second touch sensor layer are configured to cooperatively detect touch events.

22 Claims, 9 Drawing Sheets

(56) References Cited

U.S. PATENT DOCUMENTS

| | | | | |
|---|---|---|---|---|
| 2012/0319961 A1* | 12/2012 | Liu | ................ | G06F 3/041 |
| | | | | 345/173 |
| 2013/0278544 A1* | 10/2013 | Cok | ................ | G06F 3/044 |
| | | | | 345/174 |
| 2013/0293096 A1* | 11/2013 | Kang | ................ | H01H 1/10 |
| | | | | 313/511 |
| 2013/0300677 A1* | 11/2013 | Kim | ................ | G06F 3/0414 |
| | | | | 345/173 |
| 2013/0335680 A1* | 12/2013 | Su | ................ | H01L 51/5036 |
| | | | | 349/69 |

FOREIGN PATENT DOCUMENTS

| | | |
|---|---|---|
| CN | 103226403 A | 7/2013 |
| CN | 203250289 U | 10/2013 |
| CN | 203607415 U | 5/2014 |
| TW | 201001010 A | 1/2010 |
| TW | 201017264 A | 5/2010 |
| TW | 201114028 A | 4/2011 |
| TW | 201128242 A | 8/2011 |

* cited by examiner

ORGANIC LIGHT EMITTING DIODE (OLED) TOUCH DISPLAY DEVICE

This application claims priority of Chinese Patent Application No. 201310560443.1, filed on Nov. 12, 2013, the entire disclosure of which is hereby incorporated by reference.

BACKGROUND OF THE INVENTION

Field of the Invention

The disclosure relates to a display device, and more particularly to an organic light emitting diode touch display device that provides touch sense function.

Description of the Related Art

Referring to FIG. 1, a conventional organic light emitting diode (abbreviated as OLED hereinafter) display 1 mainly includes a substrate 10, an organic light emitting module 11 that is disposed on the substrate 10, and a transparent cover plate 12 (e.g., a glass plate or a polyethylene terephthalate (PET) plate) that covers the organic light emitting module 11. A space between peripheries of the substrate 10 and the transparent cover plate 12 would be sealed by a sealant 13 to confine the organic light emitting module 11 between the substrate 10 and the transparent cover plate 12 so as to protect the organic light emitting module 11 from absorption of moisture and oxidation. Since the OLED display 1 is self-luminous, when operated under relatively dark ambient light conditions or indoor environments, the OLED display 1 exhibits high contrast ratio and high color saturation. However, when operated under bright ambient light conditions (such as outdoor environment), since brightness of the OLED is much lower than that of external light of the environment, light reflected by a surface of the OLED display 1 would result in poor readability for a user.

Therefore, in order to solve the abovementioned problem, a conventional solution is to dispose an optical film unit (not shown) composed of a quarter-wave plate and a polarizer on the transparent cover plate 12 of the OLED display 1 to absorb the incident light from the external environment. The conventional polarizer includes a triacetate cellulose (TAC) film (as a protective layer), a polyvinyl alcohol (PVA) film (as a light polarizing body), and another TAC film (as a protective layer) that are laminated together, and has a thickness within the range from tens to hundreds of micrometers.

Moreover, to provide touch sense function to the OLED display 1, a commercially available touch sensor module (not shown) is provided on the optical film unit. However, volume and weight of the OLED display 1 with the touch sensor module would be severely increased. Therefore, it is difficult to apply to electronic devices with thin and lightweight demands.

SUMMARY OF THE INVENTION

Therefore, an object of the present invention is to provide an OLED touch display device that has reduced thickness and weight.

According to one aspect of this invention, an OLED touch display device includes an OLED display, and a laminated package component. The laminated package component covers the OLED display and includes a quarter-wave plate, a liquid crystal polarizer, a first touch sensor layer and a second touch sensor layer. The first touch sensor layer and the second touch sensor layer are configured to cooperatively detect touch events.

According to another aspect of this invention, an OLED touch display device includes an OLED display and a laminated package component. The OLED display includes a first touch sensor layer. The laminated package component covers the OLED display and includes a quarter-wave plate, a liquid crystal polarizer and a second touch sensor layer that cooperates with the first touch sensor layer to detect touch events.

BRIEF DESCRIPTION OF THE DRAWINGS

Other features and advantages of the present invention will become apparent in the following detailed description of the embodiments of this invention, with reference to the accompanying drawings, in which.

DETAILED DESCRIPTION OF THE EMBODIMENTS

Figure 1:
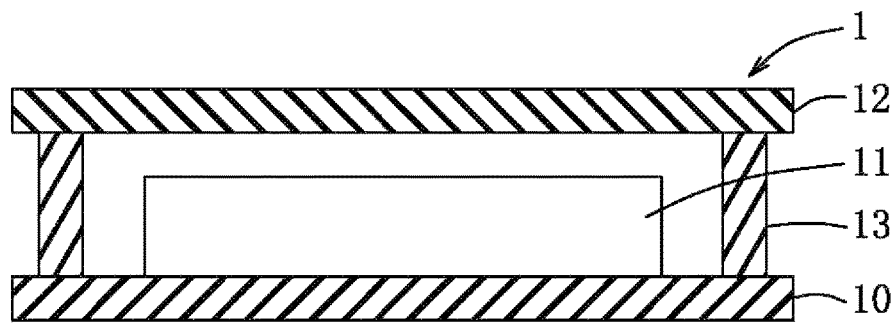
FIG. 1 is a schematic sectional view of a conventional OLED display.

Please note that like elements are denoted by the same reference numerals throughout the disclosure.

Figure 2:
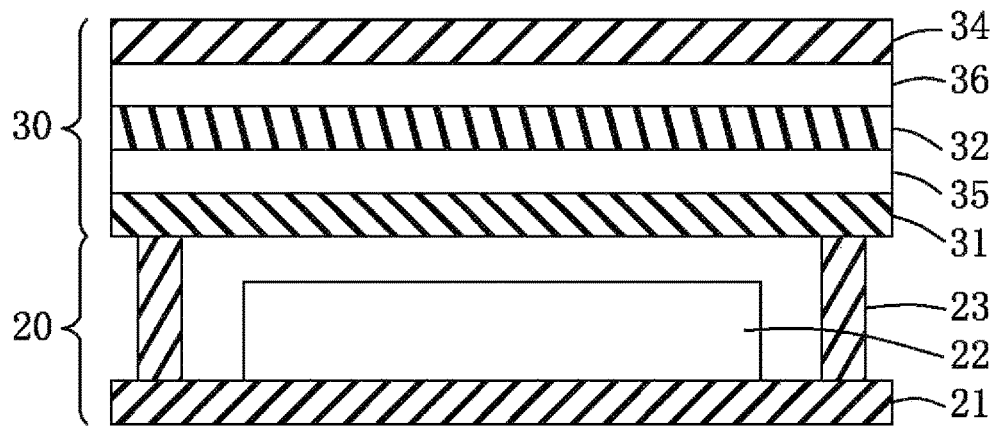
FIG. 2 is a schematic sectional view of the first embodiment of an OLED touch display device according to this invention.

Referring to FIG. 2, the first embodiment of an organic light emitting diode (OLED) touch display device according to one or more embodiments of the disclosure includes an OLED display 20 and a laminated package component 30 covering the OLED display 20. The OLED display 20 includes a substrate 21 and an organic light emitting module 22 disposed on the substrate 21. The laminated package component 30 includes a quarter-wave plate 31, a liquid crystal polarizer 32, a touch sensor structure and a cover glass 34.

To be more specific, the touch sensor structure includes a first touch sensor layer 35 and a second touch sensor layer 36. The first touch sensor layer 35 and the second touch sensor layer 36 are configured to cooperatively detect touch events. The quarter-wave plate 31, the first touch sensor layer 35, the liquid crystal polarizer 32, the second touch sensor layer 36, and the cover glass 34 are laminated in sequence along a bottom-top direction. For manufacture of the laminated package component 30, a first transparent conductive layer (not shown) is first applied on a top surface of the quarter-wave plate 31, the first transparent conductive layer is subjected to etching or laser to form the first touch sensor layer 35, liquid crystal is then coated on the first touch sensor layer 35, e.g., using a roll-to-roll procedure, to form the liquid crystal polarizer 32, a second transparent conductive layer is formed on the liquid crystal polarizer 32, the second transparent conductive layer is subjected to etching or laser to form the second touch sensor layer 36, and the cover glass 34 is lastly covered on the second touch sensor layer 36 so as to form the laminated package component 30. the first or second transparent conductive layer is made of indium tin oxide (ITO), silver nano wire, carbon nano tube, conductive polymers (poly(3,4-ethylenedioxythiophene) polystyrene sulfonate, abbreviated as PEDOT:PSS), metal mesh, or graphene.

Alternatively, another method for manufacturing the laminated package component 30 includes forming the first touch sensor layer 35 on the top surface of the quarter-wave plate 31, applying liquid crystal on the first touch sensor layer 35 to form the liquid crystal polarizer 32, forming the second touch sensor layer 36 on a bottom surface of the cover glass 34, and laminating the cover glass 34 along with the second touch sensor layer 36 on the liquid crystal polarizer 32 with the second touch sensor layer 36 facing downwardly toward the liquid crystal polarizer 32 so as to form the laminated package component 30.

Afterward, the laminated package component 30 thus formed then covers the OLED display 20 with the quarter-wave plate 31 facing downwardly toward the OLED display 20. Moreover, a space between peripheries of the substrate 21 and the quarter-wave plate 31 is sealed by a sealant 23 to confine the organic light emitting module 22 between the substrate 21 and the quarter-wave plate 31 so as to protect the organic light emitting module 22 from absorption of moisture and oxidation.

Figure 3:
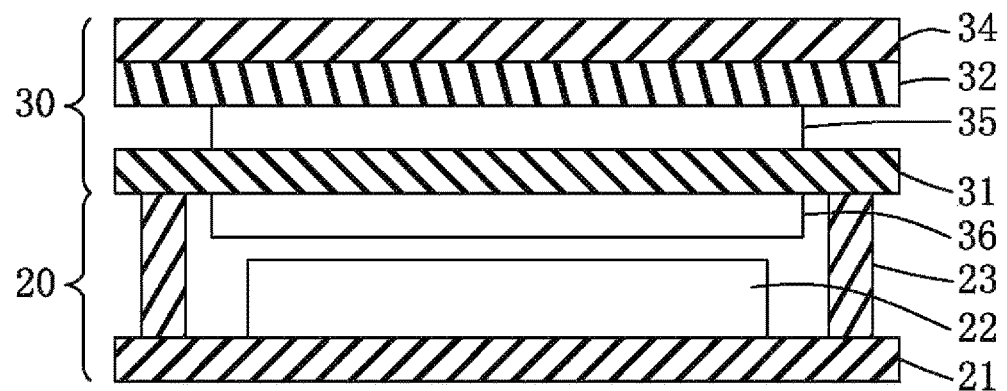
FIG. 3 is a schematic sectional view of the second embodiment of an OLED touch display device according to this invention.

Referring to FIG. 3, the second embodiment of an OLED touch display device according to one or more embodiments of the disclosure has a structure similar to that of the first embodiment, except that: the second touch sensor layer 36, the quarter-wave plate 31, the first touch sensor layer 35, the liquid crystal polarizer 32, and the cover glass 34 are laminated in sequence along the bottom-top direction. For manufacture of the laminated package component 30, first and second transparent conductive layers (not shown) are respectively applied on top and bottom surfaces of the quarter-wave plate 31, the first and second transparent conductive layers are subjected to etching or laser to form the first and second touch sensor layers 35,36, liquid crystal is then coated on the first touch sensor layer 35 to form the liquid crystal polarizer 32, and the cover glass 34 is covered on the liquid crystal polarizer 32 so as to form the laminated package component 30.

Alternatively, another method for manufacturing the laminated package component 30 includes respectively forming the first and second touch sensor layers 35, 36 on the top and bottom surfaces of the quarter-wave plate 31, coating liquid crystal on a bottom surface of the cover glass 34 to form the liquid crystal polarizer 32, and attaching the cover glass 34 along with the liquid crystal polarizer 32 on the first touch sensor layer 35 with the liquid crystal polarizer 32 facing downwardly toward the first touch sensor layer 35 so as to form the laminated package component 30.

Afterward, the laminated package component 30 thus formed then covers the OLED display 20 with the second touch sensor layer 36 facing downwardly toward the OLED display 20. Moreover, a space between peripheries of the substrate 21 and the quarter-wave plate 31 is sealed by a sealant 23 to confine the organic light emitting module 22 between the substrate 21 and the quarter-wave plate 31 so as to protect the organic light emitting module 22 from absorption of moisture and oxidation. Therefore, the OLED touch display device is accomplished.

Figure 4:
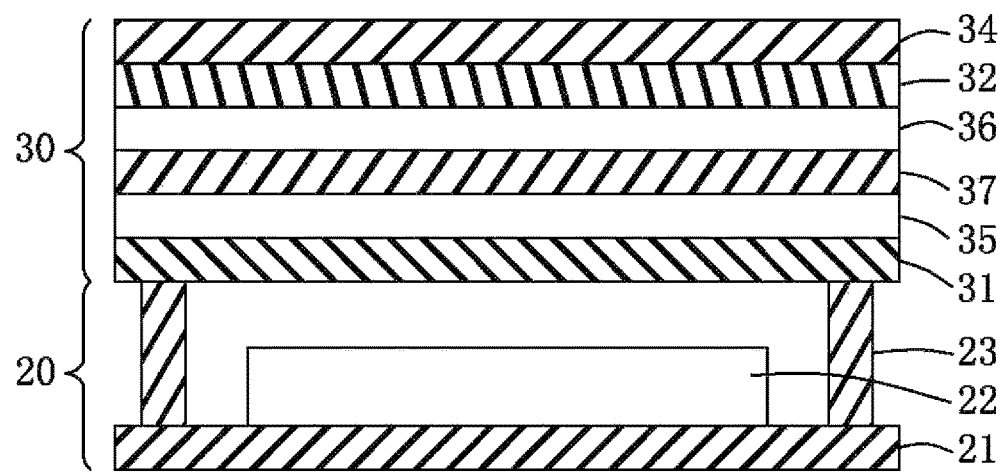
FIG. 4 is a schematic sectional view of the third embodiment of an OLED touch display device according to this invention.

Referring to FIG. 4, the third embodiment of an OLED touch display device according to one or more embodiments of the disclosure has a structure including all of the elements according to the first embodiment. Moreover, the differences between the third embodiment and the first embodiment reside in that the laminated package component 30 further includes an isolating layer 37 that is disposed between the first touch sensor layer 35 and the second touch sensor layer 36, and that the quarter-wave plate 31, the first touch sensor layer 35, the isolating layer 37, the second touch sensor layer 36, the liquid crystal polarizer 32, and the cover glass 34 are laminated in sequence along the bottom-top direction. For manufacture of the laminated package component 30, a first transparent conductive layer (not shown) is first applied on a top surface of the quarter-wave plate 31, the first transparent conductive layer is subjected to etching or laser to form the first touch sensor layer 35, the isolating layer 37 (e.g., a glass plate or a transparent PET plate) is then disposed on the first touch sensor layer 35, a second transparent conductive layer (not shown) is formed on the isolating layer 37, the second transparent conductive layer is subjected to etching or laser to form the second touch sensor layer 36, liquid crystal is then coated on a bottom surface of the cover glass 34, e.g., using a roll-to-roll procedure, to form the liquid crystal polarizer 32, and the cover glass 34 along with the liquid crystal polarizer 32 is lastly laminated on the second touch sensor layer 36 with the liquid crystal polarizer 32 facing downwardly toward the second touch sensor layer 36 so as to form the laminated package component 30.

Alternatively, another method for manufacturing the laminated package component 30 includes forming the first touch sensor layer 35 on the top surface of the quarter-wave plate 31, disposing the isolating layer 37 on the first touch sensor layer 35, forming the second touch sensor layer 36 on the isolating layer 37, coating liquid crystal on the second touch sensor layer 36 to form the liquid crystal polarizer 32, and covering the cover glass 34 on the liquid crystal polarizer 32 so as to form the laminated package component 30.

Afterward, the laminated package component 30 thus formed then covers the OLED display 20 with the quarter-wave plate 31 facing downward toward the OLED display 20. Moreover, a space between peripheries of the substrate 21 and the quarter-wave plate 31 is sealed by a sealant 23 to confine the organic light emitting module 22 between the substrate 21 and the quarter-wave plate 31 so as to protect the organic light emitting module 22 from absorption of moisture and oxidation. Therefore, the OLED touch display device is accomplished.

Figure 5:
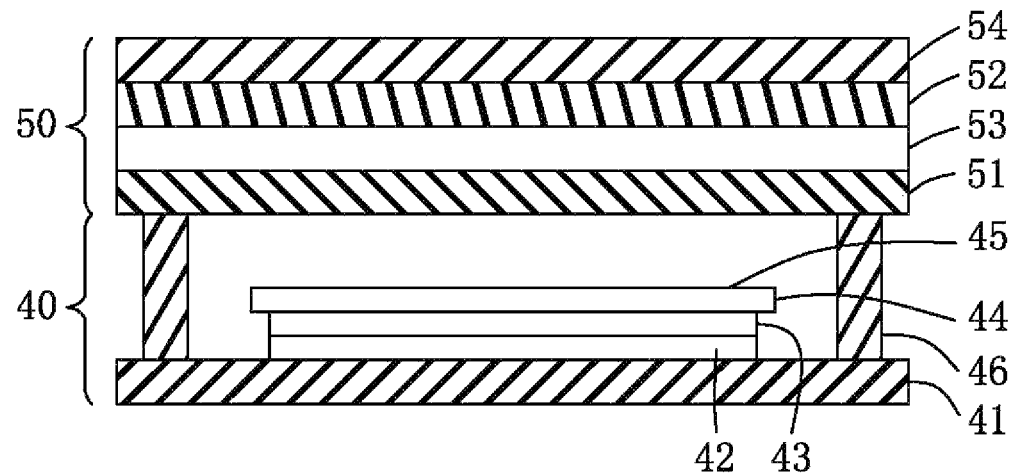
FIG. 5 is a schematic sectional view of the fourth embodiment of an OLED touch display device according to this invention.

Referring to FIG. 5, the fourth embodiment of an OLED touch display device according to one or more embodiments of the disclosure includes an OLED display 40 and a laminated package component 50 covering the OLED display 40. The OLED display 40 includes a substrate 41, a bottom electrode layer 42 disposed a top surface of on the substrate 41, an organic light emitting layer 43 disposed on a top surface of the bottom electrode layer 42, and a top electrode layer 44 disposed on a top surface of the organic light emitting layer 43. The organic light emitting layer 43 includes an electron-transporting layer, an organic layer, a hole-transporting layer, and a hole-injection layer that are laminated in sequence along the bottom-top direction. The top electrode layer 44 includes the first touch sensor layer 45. To be more specific, in this embodiment, the first touch sensor layer 45 is a part of the top electrode layer 44. That is to say, the top electrode layer 44 is a co-electrode layer that covers the organic light emitting layer 43, and the top electrode layer 44 is divided into a plurality of spaced-apart regions that constitutes the touch sensor layer 45. To be more specific, the top electrode 44 and the first touch sensor layer 45 are driven to perform different functions at different time. The display type of the OLED display 20 is changed from a general type (in all frames the top electrode layer 44 connects to a constant voltage) to a time-division multiplexing type. In the situation where a touch signal or a plurality of touch signals are inserted between a plurality of display driving signals of the OLED display 20, when the input is the display driving signals, the top electrode layer 44 and the bottom electrode layer 42 are electrically connected, the OLED display 20 shows images; when the input is the touch signal, the spaced-apart regions of the top electrode layer 44 (i.e., the touch sensor layer 45) cooperates with the second touch sensor layer 53 to detect the position of touch events.

The laminated package component 50 includes a quarter-wave plate 51, a liquid crystal polarizer 52, a second touch sensor layer 53 that cooperates with the first touch sensor layer 45 to detect touch events, and a cover glass 54. To be more specific, the quarter-wave plate 51, the second touch sensor layer 53, the liquid crystal polarizer 52 and the cover glass 54 are laminated in sequence along the bottom-top direction. For manufacture of the laminated package component 50, a transparent conductive layer (not shown) is formed on a top surface of the quarter-wave plate 51, the transparent conductive layer is subjected to etching or laser to form the second touch sensor layer 53, liquid crystal is then coated on the second touch sensor layer 53 to form the liquid crystal polarizer 52, and the cover glass 54 is covered on the liquid crystal polarizer 52 so as to form the laminated package component 50.

Alternatively, another method for manufacturing the laminated package component 50 includes forming the second touch sensor layer 53 on the top surface of the quarter-wave plate 51, coating liquid crystal on a bottom surface of the cover glass 54 to form the liquid crystal polarizer 52, and attaching the cover glass 54 along with the liquid crystal polarizer 52 on the second touch sensor layer 53 with the liquid crystal polarizer 52 facing downwardly toward the second touch sensor layer 53 so as to form the laminated package component 50.

Afterward, the laminated package component 50 thus formed then covers the OLED display 40 with the quarter-wave plate 51 facing downwardly toward the OLED display 40. Moreover, a space between peripheries of the substrate 41 and the quarter-wave plate 51 is sealed by a sealant 46 to confine the organic light emitting module 42 between the substrate 41 and the quarter-wave plate 51 so as to protect the organic light emitting module 42 from absorption of moisture and oxidation. Therefore, the OLED touch display device is accomplished.

Moreover, the second touch sensor layer 53 and the liquid crystal polarizer 52 of the laminated package component 50 can also be exchanged in position. That is, for manufacture of the laminated package component 50, liquid crystal is first coated on a top surface of the quarter-wave plate 51, e.g., using a roll-to-roll procedure, to form the liquid crystal polarizer 52, the second touch sensor layer 53 is then formed on a top surface of the liquid crystal polarizer 52, and the cover glass 54 is lastly covered on the second touch sensor layer 53. Alternatively, another method for manufacturing the laminated package component 50 includes forming the liquid crystal polarizer 52 on the top surface of the quarter-wave plate 51, forming the second touch sensor layer 53 on a bottom surface of the cover glass 54, and attaching the cover glass 54 along with the second touch sensor layer 53 on the liquid crystal polarizer 52 with the second touch sensor layer 53 facing downwardly toward the liquid crystal polarizer 52 so as to form the laminated package component 50.

Figure 6:
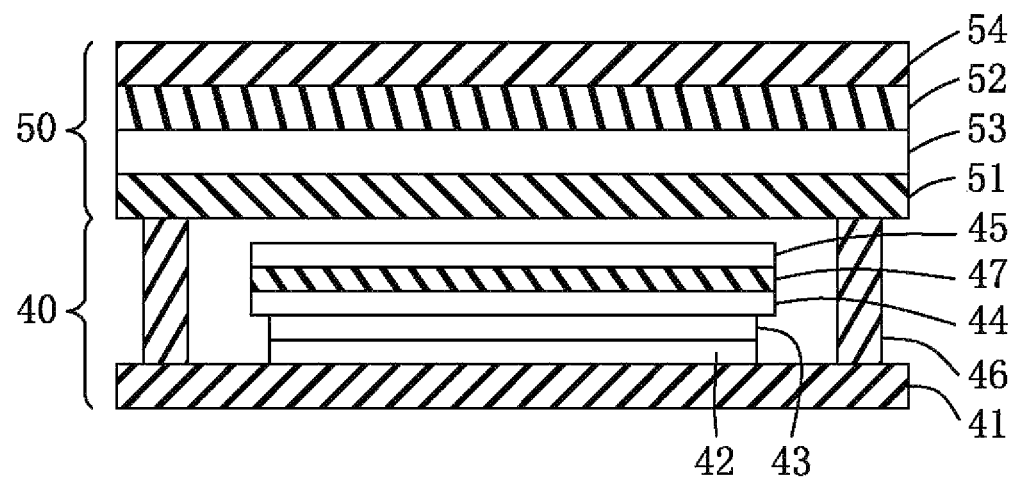
FIG. 6 is a schematic sectional view of the fifth embodiment of an OLED touch display device according to this invention.

Referring to FIG. 6, the fifth embodiment of an OLED touch display device according to one or more embodiments of the disclosure has a structure including all of the elements according to the fourth embodiment. The differences between the fifth embodiment and the fourth embodiment reside in that the OLED display 40 further includes an isolating layer 47 disposed on the top electrode layer 44, and that the first touch sensor layer 45 is disposed on a top surface of the isolating layer 47. That is to say, for manufacture of the OLED display 40, a transparent conductive layer (not shown) is applied on a top surface of the isolating layer 47. The transparent conductive layer is then subjected to etching or laser processing to form the first touch sensor layer 45.

Figure 7:
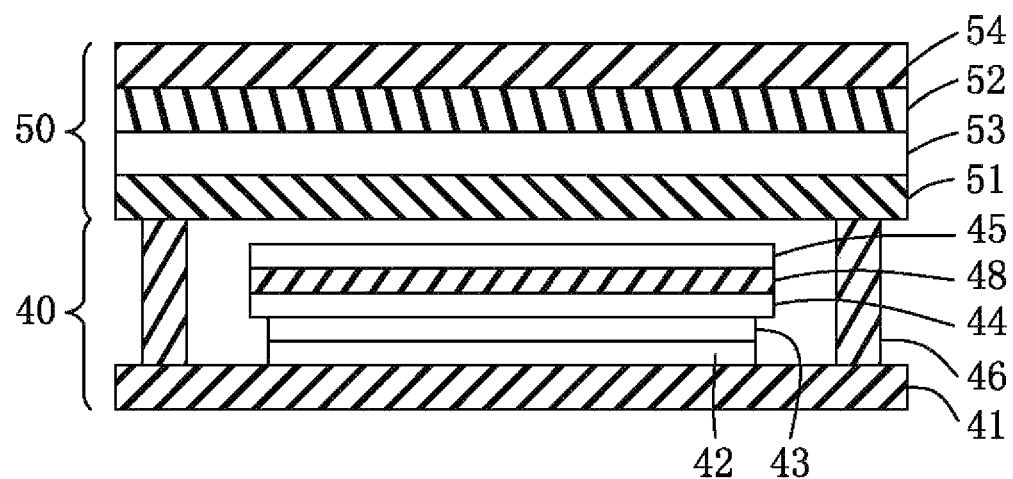
FIG. 7 is a schematic sectional view of the sixth embodiment of an OLED touch display device according to this invention.
Figure 8:
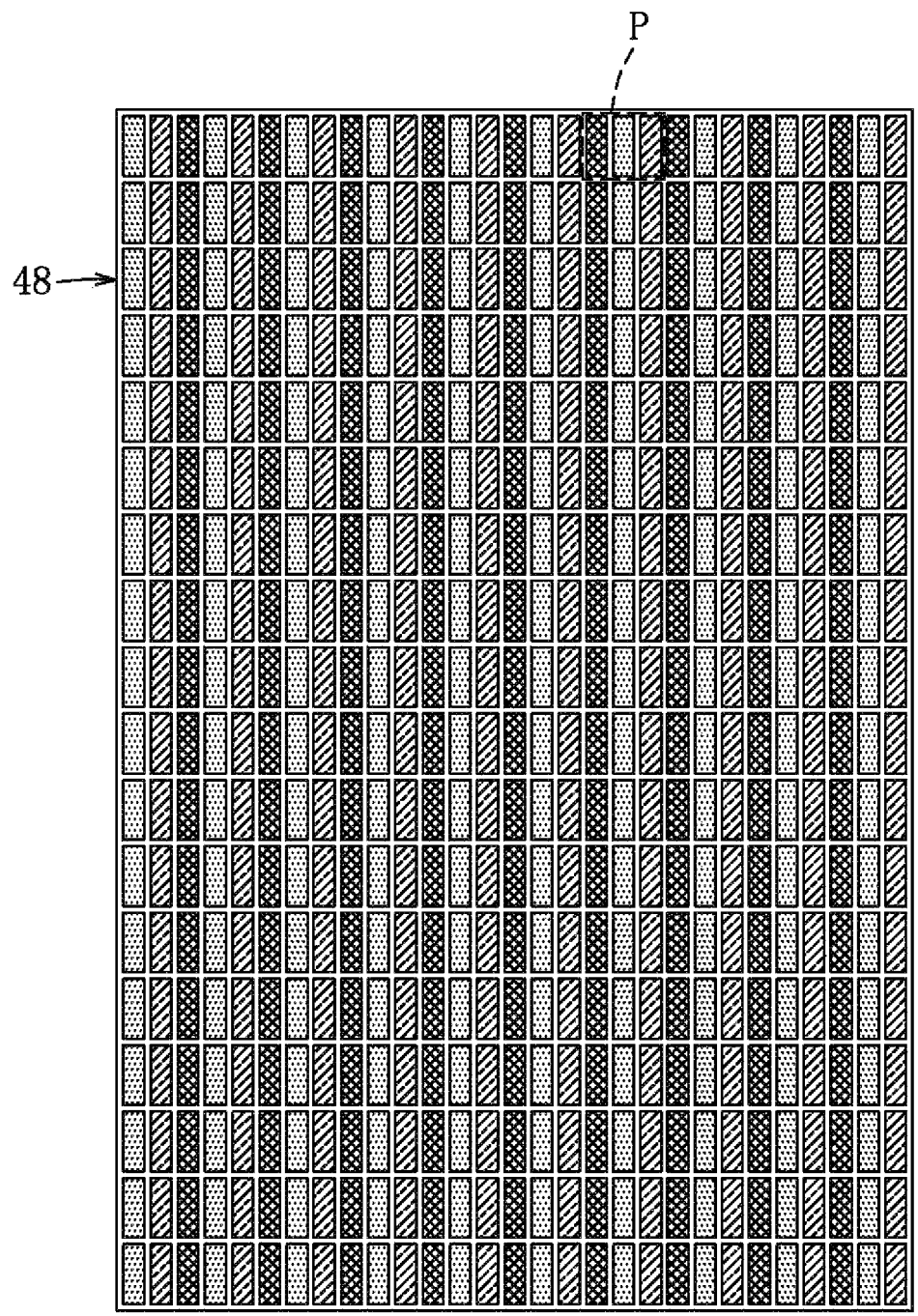
FIG. 8 is a top schematic view of a light emitting structure of an OLED display of the sixth embodiment.
Figure 9:
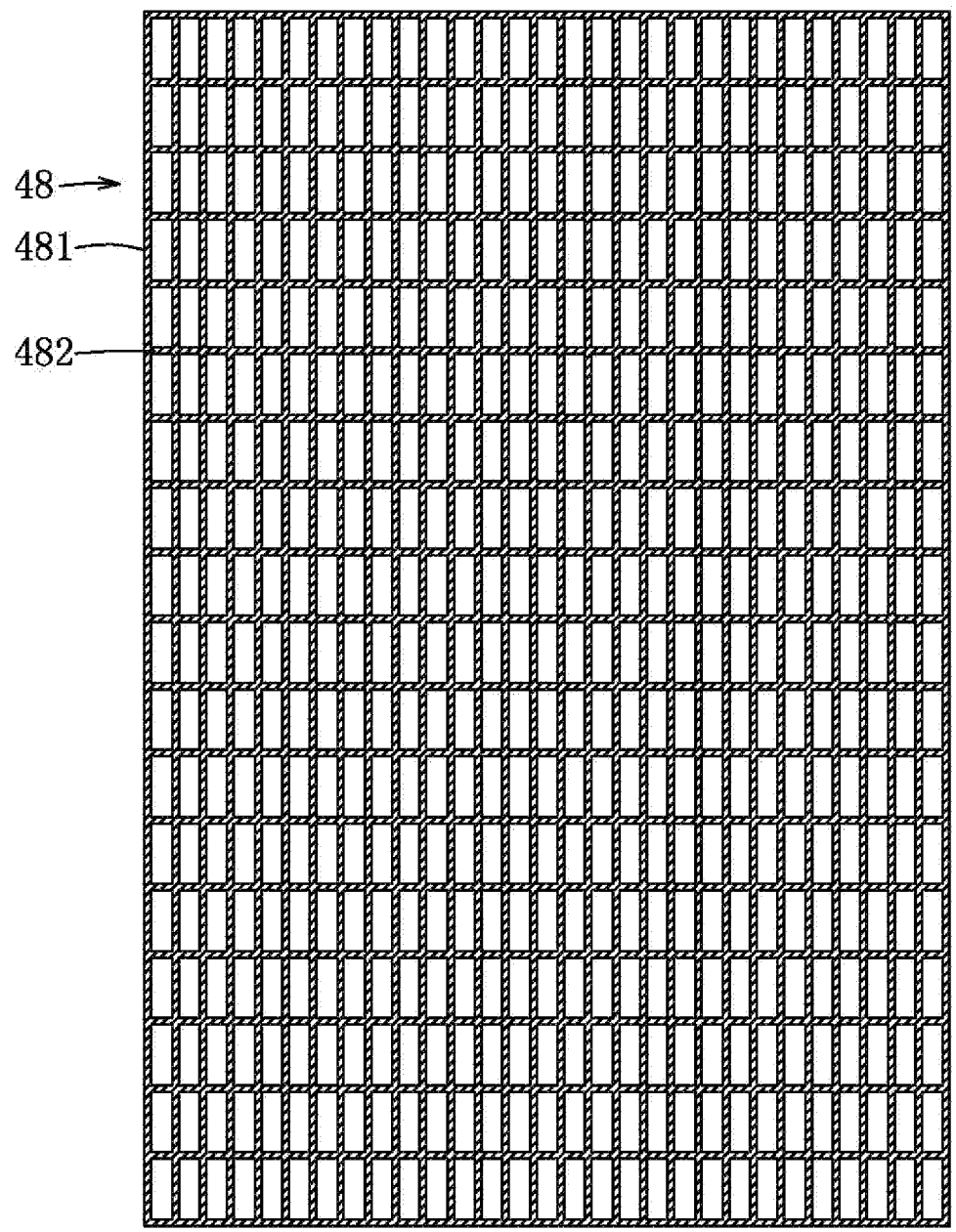
FIG. 9 is a top schematic view of an opaque layer of the OLED display of the sixth embodiment.

Referring to FIGS. 7 to 9, FIG. 7 shows the sixth embodiment of an OLED touch display device according to one or more embodiments of the disclosure. The sixth embodiment has a structure similar to that of the fourth embodiment. The OLED display 40 includes an opaque layer 48 disposed on a top surface of the top electrode layer 44. The organic light emitting layer 43 includes a plurality of pixels, and each pixel includes three sub-pixels. As shown in FIG. 8, a plurality of pixels P that are arranged in an array, and each of the pixels P includes red, green, and blue (RGB) sub-pixels. Referring to FIG. 9, the opaque layer 48 includes a transparent isolating plate 481, and a black matrix 482 that is formed on a bottom surface of the transparent isolating plate 481 and that isolates the sub-pixels from one another. The OLED display in any of the embodiments shown in FIG. 2 to FIG. 6 can also include the opaque layer (as described in this embodiment) despite the opaque layer not being shown in FIGS. 2 to 6. The differences between the embodiment shown in FIG. 9 and the fourth embodiment reside in that the first touch sensor layer 45 is disposed on the opaque layer 48. That is, a transparent conductive layer (not shown) is applied on a top surface of the transparent isolating plate 481, and then the transparent conductive layer is subjected to etching or laser processing to form the first touch sensor layer 45.

Figure 10:
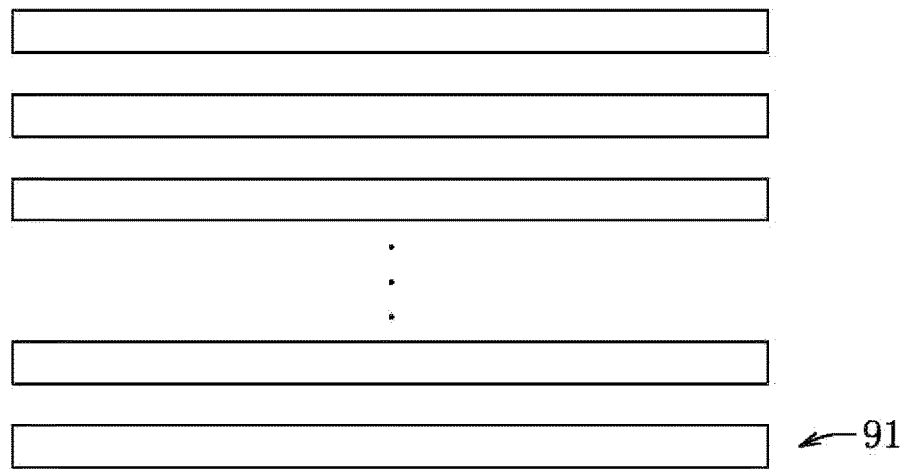
FIG. 10 is a schematic view of electrode lines of one of a first touch sensor layer and a second touch sensor layer used in the first to sixth embodiments.
Figure 11:
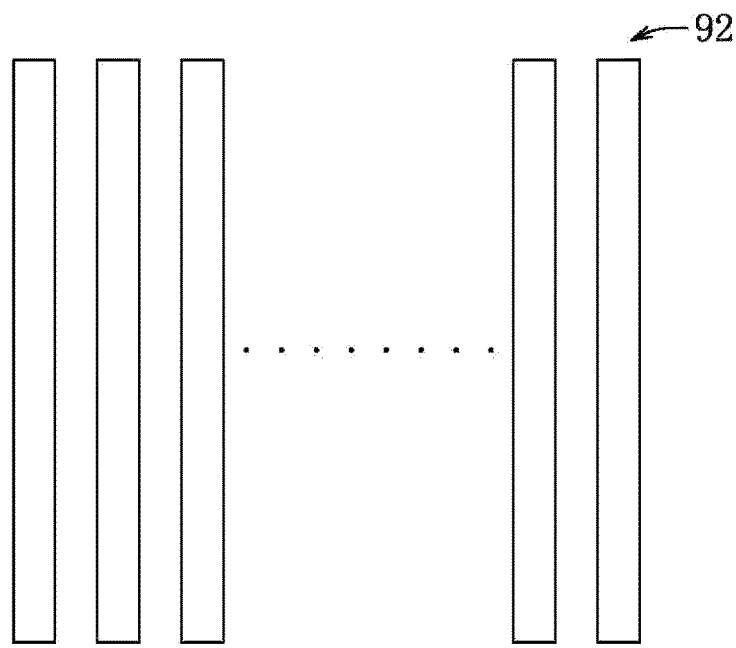
FIG. 11 is a schematic view of electrode lines of the other one of the first touch sensor layer and the second touch sensor layer used in the first to sixth embodiments.
Figure 12:
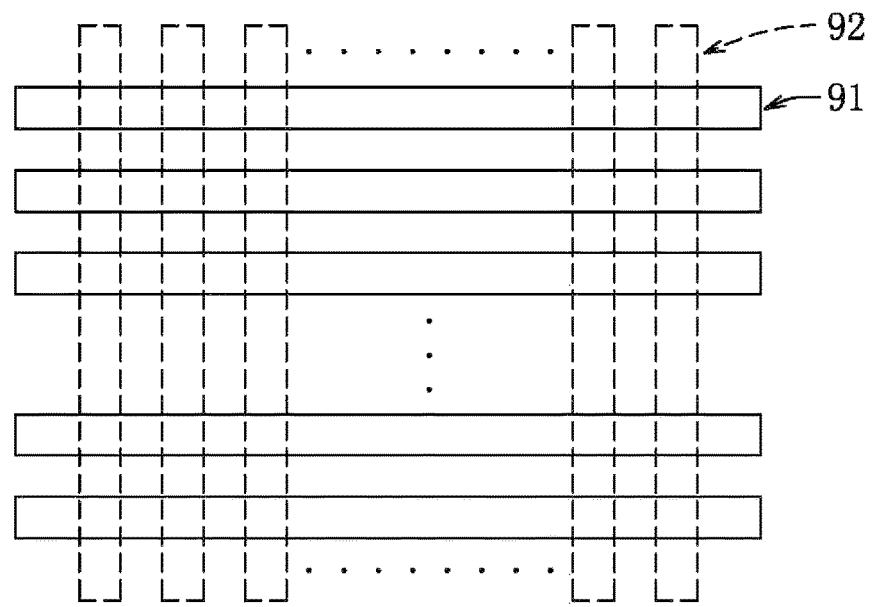
FIG. 12 is a schematic view showing the arrangement of the electrode lines of the first and second touch sensor layers shown in FIGS. 10 and 11.

Moreover, in the first to sixth embodiments, referring to FIG. 10, the first touch sensor layer 35, 45 or the second touch sensor layer 36, 53 includes a plurality of first electrode lines 91 that extend along a first direction (e.g., an X-axial direction). Referring to FIG. 11, the other one of the first touch sensor layer 35, 45 or the second touch sensor layer 36, 53 includes a plurality of second electrode lines 92 that extend along a second direction (e.g., a Y-axial direction). The second direction is not parallel to the first direction. In some embodiments, the second direction is substantially perpendicular to the first direction. The first electrode lines 91 and the second electrode lines 92 cooperatively constitute the touch sensor structure, as shown in FIG. 12.

Figure 13:
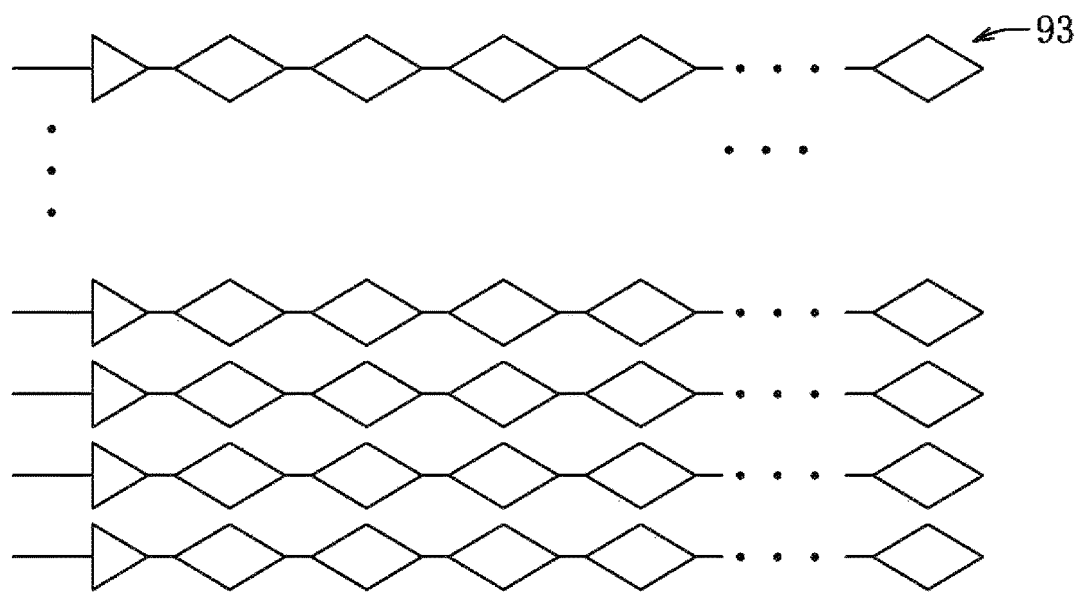
FIG. 13 is a schematic view of electrode arrays of one of a first touch sensor layer and a second touch sensor layer used in the first to sixth embodiments.
Figure 14:
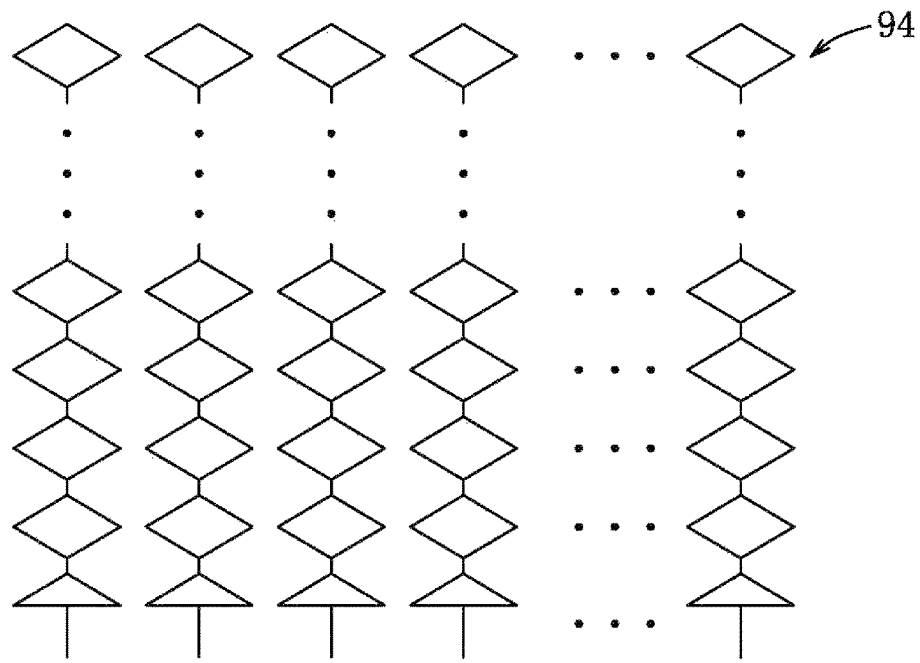
FIG. 14 is a schematic view of electrode arrays of the other one of the first touch sensor layer and the second touch sensor layer used in the first to sixth embodiments.
Figure 15:
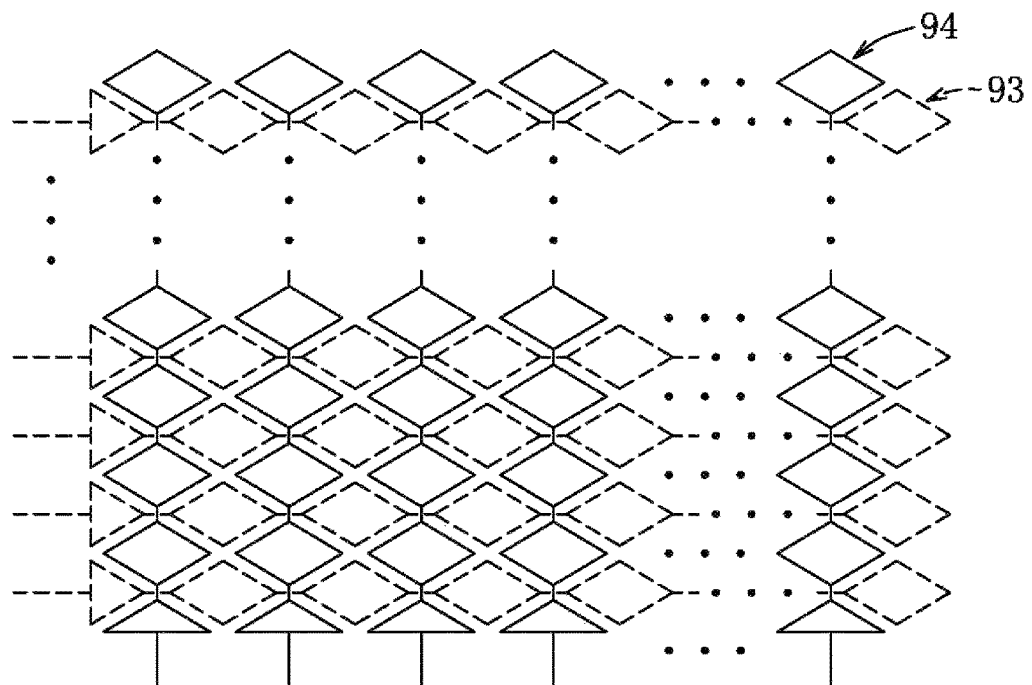
FIG. 15 is a schematic view showing the arrangement of the electrode arrays of the first and second touch sensor layers shown in FIGS. 13 and 14.

Alternatively, in the first to sixth embodiments, referring to FIG. 13, one of the first touch sensor layer 35, 45 and the second touch sensor layer 36, 53 includes a plurality of first electrode arrays 93 that extend along a first direction (e.g., an X-axial direction). Referring to FIG. 14, the other one of the first touch sensor layer 35, 45 and the second touch sensor layer 36, 53 includes a plurality of second electrode arrays 94 that extend along a second direction (e.g., a Y-axial direction). The second direction crosses the first direction. Each of the first electrode arrays 93 and the second electrode arrays 94 includes a plurality of diamond-shaped electrodes or diamond-like electrodes that are arranged in a straight line and that are electrically connected in series. The first electrode arrays 93 and the second electrode arrays 94 cooperatively constitute the touch sensor structure, as shown in FIG. 15. Of course, structures of the first touch sensor layer 35, 45 and the second touch sensor layer 36, 53 are not limited thereto. In some embodiments, the first touch sensor layer 35, 45 and the second touch sensor layer 36, 53 are arranged into a double-layer touch sensor structure capable of detecting touch events.

When incident light from an external environment travels into the laminated package component 30, 50 of the OLED touch display device according to the first to sixth embodiments, the liquid crystal polarizer 32, 52 transforms the incident light into a linearly polarized light. Afterward, the linearly polarized light penetrates the quarter-wave plate 31, 51 twice and transforms into another linearly polarized light that is perpendicular to the original linearly polarized light and that is then fully absorbed by the liquid crystal polarizer 32, 52. Therefore, the incident light from the external environment can be completely absorbed by the laminated package component 30, 50. Moreover, the first and second touch sensor layers 35, 36 that are integrated in the laminated package component 30 or the first and second touch sensor layers 45, 53 that are respectively integrated into the OLED display 40 and the laminated package component 50 are able to detect touch events.

Furthermore, the liquid crystal polarizer 32, 52 is made by utilizing a self-assembly property of liquid crystal molecules (e.g., cholesteric liquid crystal) and a surface alignment technology to carry out a regular arrangement of liquid crystal over a relatively large area. After curing, a thin film that has a crystal structure can be formed. The liquid crystal polarizer 32, 52 thus formed has a thickness of one to several micrometers which is significantly less than the thickness of the conventional polarizer since no TAC protective layer is used. Moreover, by virtue of a specific coating technique, the thickness of the liquid crystal polarizer 32, 52 could be reduced to about 1 micrometer, thereby further reducing the thickness of the laminated package component 30, 50. Besides, since the conventional polarizer is not used in the embodiments, there is no need to worry about the shortage of the material of the conventional polarizer. Moreover, producers can coat the liquid crystal to form the liquid crystal polarizer 32, 52 by themselves so that manufacturing time could be reduced. The thickness and position of the liquid crystal polarizer 32, 52 in the laminated package component 30, 50 could also be freely adjusted to meet various product requirements. The cost of purchasing the conventional polarizer can also be eliminated, thereby reducing manufacturing costs.

Moreover, in the previous first to sixth embodiments, the laminated package component 30, 50 may further include a decoration layer, which could be disposed on a bottom surface of the cover glass 34, 54 or a top or bottom surface of the quarter-wave plate 31, 51.

To sum up, in the previous embodiments, by forming the liquid crystal polarizer and the touch sensor structure on the quarter-wave plate to replace the conventional cover plate of the conventional OLED display, the OLED touch display device of the present invention simultaneously exhibits a display function, an optical anti-reflective function, and a touch sensor function. The transparent cover plate used in the conventional OLED display, a cover plate used in the conventional touch sensor module, and two layers of optical clear adhesive (OCA) for adhering the cover plates could be dispensed with, thereby effectively reducing the thickness and the weight of the OLED touch display device according to this invention. Moreover, in this invention, liquid crystal material is used to produce the polarizer and thus the thickness of the polarizer can be reduced from several hundreds of micrometers to several micrometers, thereby further reducing the thickness of the OLED touch display device. As a result, the advantages and the object of present invention could be accomplished.

While the disclosure includes description in connection with what are considered the most practical embodiments, it is understood that this disclosure is not limited to the embodiments disclosed, but is intended to cover various arrangements included within the spirit and scope of the broadest interpretation and equivalent arrangements.

What is claimed is:

1. An organic light emitting diode (OLED) touch display device, comprising:
   an OLED display including a substrate, a first touch sensor layer over said substrate, and an organic light emitting layer between said substrate and said first touch sensor layer; and
   a laminated package component covering said OLED display, said laminated package component including:
      a quarter-wave plate, wherein:
         a gap is defined between a top surface of said first touch sensor layer and a bottom surface of said quarter-wave plate, and
         a sealant extends from a top surface of said substrate to a bottom surface of said quarter-wave plate,
      a liquid crystal polarizer, and
      a second touch sensor layer that cooperates with said first touch sensor layer to detect touch events.

2. The OLED touch display device as claimed in claim 1, wherein:
   said second touch sensor layer is disposed on a top surface of said quarter-wave plate, and
   said liquid crystal polarizer is disposed on a top surface of said second touch sensor layer.

3. The OLED touch display device as claimed in claim 2, wherein said laminated package component further includes a cover glass covering said liquid crystal polarizer.

4. The OLED touch display device as claimed in claim 3, wherein said liquid crystal polarizer is in direct contact with said cover glass.

5. The OLED touch display device as claimed in claim 1, wherein:
said laminated package component further includes a cover glass,
said second touch sensor layer is disposed on a top surface of said quarter-wave plate,
said liquid crystal polarizer is disposed on a bottom surface of said cover glass, and
said cover glass along with said liquid crystal polarizer is laminated on said second touch sensor layer with said liquid crystal polarizer facing downwardly toward said second touch sensor layer.

6. The OLED touch display device as claimed in claim 1, wherein:
said liquid crystal polarizer is disposed on a top surface of said quarter-wave plate, and
said second touch sensor layer is disposed on a top surface of said liquid crystal polarizer.

7. The OLED touch display device as claimed in claim 6, wherein said laminated package component further includes a cover glass covering said second touch sensor layer.

8. The OLED touch display device as claimed in claim 1, wherein:
said laminated package component further includes a cover glass,
said liquid crystal polarizer is disposed on a top surface of said quarter-wave plate,
said second touch sensor layer is disposed on a bottom surface of said cover glass, and
said cover glass along with said second touch sensor layer is laminated on said liquid crystal polarizer with said second touch sensor layer facing downwardly toward said liquid crystal polarizer.

9. The OLED touch display device as claimed in claim 1, wherein:
said OLED display includes a top electrode layer, and
said top electrode layer includes said first touch sensor layer.

10. The OLED touch display device as claimed in claim 1, wherein:
said OLED display includes a top electrode layer and an isolating layer disposed on a top surface of said top electrode layer, and
said first touch sensor layer is disposed on a top surface of said isolating layer.

11. The OLED touch display device as claimed in claim 1, wherein:
said OLED display includes:
a bottom electrode layer disposed on said top surface of said substrate, wherein said organic light emitting layer is disposed on a top surface of said bottom electrode layer,
a top electrode layer disposed on a top surface of said organic light emitting layer, and
an opaque layer disposed on a top surface of said top electrode layer, wherein:
said opaque layer includes a transparent isolating plate and a black matrix, and
said first touch sensor layer is disposed on a top surface of said opaque layer.

12. The OLED touch display device as claimed in claim 11, wherein:
said organic light emitting layer includes a plurality of pixels that are arranged in array,
each of said pixels includes a plurality of sub-pixels,
said black matrix is formed on a bottom surface of said transparent isolating plate,
said black matrix overlies spaces between said sub-pixels, and
said first touch sensor layer is disposed on a top surface of said transparent isolating plate.

13. The OLED touch display device as claimed in claim 11, wherein said opaque layer is in direct contact with said first touch sensor layer and said top electrode layer.

14. The OLED touch display device as claimed in claim 1, wherein:
one of said first touch sensor layer or said second touch sensor layer includes a plurality of first electrode lines that extend along a first direction, and
another of said first touch sensor layer or said second touch sensor layer includes a plurality of second electrode lines that extend along a second direction crossing said first direction.

15. The OLED touch display device as claimed in claim 1, wherein a distance between a sidewall of said sealant and a sidewall of said organic light emitting layer is different than a distance between said sidewall of said sealant and a sidewall of said first touch sensor layer.

16. The OLED touch display device as claimed in claim 1, wherein said first touch sensor layer is spaced apart from said sealant by a second gap.

17. The OLED touch display device as claimed in claim 1, wherein said quarter-wave plate and said first touch sensor layer are spaced apart only by said gap.

18. The OLED touch display device as claimed in claim 1, wherein said second touch sensor layer is in direct contact with said quarter-wave plate and said liquid crystal polarizer.

19. An organic light emitting diode (OLED) touch display device, comprising:
an OLED display including a substrate, a first touch sensor layer over said substrate, and an organic light emitting layer between said substrate and said first touch sensor layer; and
a laminated package component over said first touch sensor layer, said laminated package component including:
a quarter-wave plate, wherein a sealant extends from a top surface of said substrate to a bottom surface of said quarter-wave plate, wherein said first touch sensor layer and said quarter-wave plate are spaced apart by a gap,
a liquid crystal polarizer, and
a second touch sensor layer that cooperates with said first touch sensor layer to detect touch events.

20. The OLED touch display device as claimed in claim 19, wherein said second touch sensor layer is in direct contact with a top surface of said quarter-wave plate and a bottom surface of said liquid crystal polarizer.

21. The OLED touch display device as claimed in claim 19, wherein a distance between a sidewall of said sealant and a sidewall of said organic light emitting layer is different than a distance between said sidewall of said sealant and a sidewall of said first touch sensor layer.

22. The OLED touch display device as claimed in claim 19, wherein said first touch sensor layer is spaced apart from said sealant by a second gap.

* * * * *